(12) United States Patent
Wang et al.

(10) Patent No.: US 7,217,660 B1
(45) Date of Patent: May 15, 2007

(54) METHOD FOR MANUFACTURING A SEMICONDUCTOR COMPONENT THAT INHIBITS FORMATION OF WORMHOLES

(75) Inventors: Connie Pin-Chin Wang, Mountain View, CA (US); Paul R. Besser, Sunnyvale, CA (US); Jinsong Yin, Sunnyvale, CA (US); Hieu T. Pham, Milpitas, CA (US); Minh Van Ngo, Fremont, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 122 days.

(21) Appl. No.: 11/109,964

(22) Filed: Apr. 19, 2005

(51) Int. Cl.
*H01L 21/22* (2006.01)
(52) U.S. Cl. ...................... 438/685; 438/700
(58) Field of Classification Search ........... 438/303, 438/304, 184, 265, 582, 656, 648, 683, 685, 438/700, 704
See application file for complete search history.

(56) References Cited

U.S. PATENT DOCUMENTS

| | | | | |
|---|---|---|---|---|
| 6,573,168 | B2* | 6/2003 | Kim et al. | 438/586 |
| 6,599,794 | B2* | 7/2003 | Kiyotoshi et al. | 438/240 |
| 6,635,965 | B1 | 10/2003 | Lee et al. | |
| 6,709,904 | B2* | 3/2004 | Chaudhry et al. | 438/156 |
| 6,781,180 | B1* | 8/2004 | Martin et al. | 257/301 |
| 6,917,076 | B2* | 7/2005 | Eguchi et al. | 257/340 |
| 6,995,073 | B2* | 2/2006 | Liou | 438/421 |
| 2002/0086111 | A1 | 7/2002 | Byun et al. | |
| 2003/0049931 | A1 | 3/2003 | Byun et al. | |
| 2003/0082910 | A1* | 5/2003 | Walsh | 438/689 |
| 2004/0127017 | A1 | 7/2004 | Jung et al. | |
| 2004/0142557 | A1 | 7/2004 | Levy et al. | |
| 2004/0202786 | A1 | 10/2004 | Wongsenakhum et al. | |
| 2005/0000431 | A1 | 1/2005 | Elers | |
| 2005/0009325 | A1 | 1/2005 | Chung et al. | |
| 2005/0023516 | A1 | 2/2005 | Chopra | |
| 2005/0031786 | A1 | 2/2005 | Lee et al. | |
| 2005/0035409 | A1 | 2/2005 | Ko et al. | |
| 2005/0035460 | A1 | 2/2005 | Tseng | |
| 2005/0046028 | A1 | 3/2005 | Jung | |

OTHER PUBLICATIONS

Novellus Ships 100th ALTUS® PNL™ Module for Tungsten Deposition, 300-mm Tool destined for major Korean DRAM production fab, Sep. 23, 2004, Novellus Press Release, pp. 1-2.

(Continued)

*Primary Examiner*—S. V. Clark
(74) *Attorney, Agent, or Firm*—Farjami & Farjami LLP (57) ABSTRACT

A method for manufacturing a semiconductor component that inhibits formation of wormholes in a semiconductor substrate. A contact opening is formed in a dielectric layer disposed on a semiconductor substrate. The contact opening exposes a portion of the semiconductor substrate. A sacrificial layer of oxide is formed on the exposed portion of the semiconductor substrate and along the sidewalls of the contact opening. Silane is reacted with tungsten hexafluoride to form a hydrofluoric acid vapor and tungsten. The hydrofluoric acid vapor etches away the sacrificial oxide layer and a thin layer of tungsten is formed on the exposed portion of the semiconductor substrate. After forming the thin layer of tungsten, the reactants may be changed to more quickly fill the contact opening with tungsten.

4 Claims, 5 Drawing Sheets

OTHER PUBLICATIONS

Novellus Launches ALTUS® Directfill™ Tungsten Nitride/Tungsten Deposition System for 65 NM and Below, Breakthrough single-platform architecture for advanced contact and via-fill improves device performance; cuts overall CoO; Nov. 24, 2004, Novellus Press Release, pp. 1-2.

* cited by examiner

METHOD FOR MANUFACTURING A SEMICONDUCTOR COMPONENT THAT INHIBITS FORMATION OF WORMHOLES

FIELD OF THE INVENTION

The present invention relates, in general, to a metallization system suitable for use in a semiconductor component and, more particularly, to a metallization system comprising tungsten.

BACKGROUND OF THE INVENTION

Semiconductor component manufacturers are constantly striving to increase the speeds of their components. Because a semiconductor component, such as a microprocessor, contains up to a billion transistors or devices, the focus for increasing speed has been to decrease gate delays of the semiconductor devices that make up the semiconductor component. As a result, the gate delays have been decreased to the point that speed is now primarily limited by the propagation delay of the metallization system used to interconnect the semiconductor devices with each other and with elements external to the semiconductor component. Metallization systems are typically comprised of a plurality of interconnect layers vertically separated from each other by a dielectric material and electrically coupled to each other by metal-filled vias or conductive plugs. Each layer contains metal lines, metal-filled vias, or combinations thereof separated by an insulating material. Typically, the metallization system is coupled to the semiconductor substrate through a metal contact.

A figure of merit describing the delay of the metallization system is its Resistance-Capacitance (RC) delay. The RC delay can be derived from the resistance of the metal layer and the associated capacitance within and between different layers of metal in the metallization system. Included in the resistance component of the metallization system is the contact resistance between the metal contact and the semiconductor substrate. The metal may directly contact the semiconductor substrate or it may be coupled to the semiconductor substrate through a metal silicide layer. Many types of metal can be used for the contact. Typical metals include titanium, tantalum, tungsten, cobalt, nickel, copper, aluminum, or the like. When the metal is tungsten, a titanium liner is formed on the semiconductor substrate or the silicide, a titanium nitride barrier layer is formed over the titanium liner, and tungsten is formed on the titanium nitride layer. The titanium liner lowers the contact resistance between the semiconductor substrate and the tungsten. The titanium nitride barrier layer prevents fluorine that is used in the tungsten deposition process from attacking the semiconductor material and forming pits in it. Pit formation is undesirable because tungsten becomes deposited in these pits, thereby increasing the contact resistance. These tungsten-filled pits are referred to as wormholes. In a conventional tungsten contact process, the tungsten is not conformally deposited. Thus, tungsten seams or gaps are formed in small tungsten contacts which increase the contact resistance. Another drawback with the conventional tungsten contact process is that the titanium liner and titanium nitride barrier layers involve sophisticated processing steps with low throughputs, which increase the cost of manufacturing the semiconductor component.

Accordingly, it would be advantageous to have a method for manufacturing a tungsten contact that inhibits wormhole formation. It would be of further advantage for the method to be cost and time efficient.

SUMMARY OF THE INVENTION

The present invention satisfies the foregoing need by providing a method for manufacturing a semiconductor component. In accordance with one embodiment, the present invention includes providing a semiconductor material and forming dielectric material over the semiconductor material. An opening having sidewalls and a floor is formed in the dielectric material. A layer of sacrificial material is deposited on the floor and the sidewalls. The layer of sacrificial material is replaced with either tungsten or tungsten nitride. A tungsten contact is formed on either the tungsten or the tungsten nitride.

In accordance with another embodiment, the present invention includes a method for manufacturing a semiconductor component comprising providing a substrate and forming a layer of dielectric material over the substrate. A contact opening having a floor and sidewalls is formed in the layer of dielectric material. A layer of sacrificial material is formed on the floor and the sidewalls. The layer of sacrificial material is removed and contemporaneously a material comprising tungsten is formed over the substrate.

In accordance with yet another embodiment, the present invention includes a method for manufacturing a semiconductor component comprising providing a substrate and forming a layer of dielectric material over the substrate. An opening having sidewalls is formed in the layer of dielectric material. The opening exposes a portion of the substrate. A semiconductor material is formed on the exposed portion of the substrate using a silane plasma treatment. A barrier metal layer is formed on the semiconductor material.

In accordance with yet another embodiment, the present invention includes a method for manufacturing a semiconductor component comprising providing a substrate and forming a layer of dielectric material over the substrate. An opening having sidewalls is formed in the layer of dielectric material. The opening exposes a portion of the substrate. A layer of titanium nitride is formed on the exposed portion of the substrate using atomic layer deposition. A layer of tungsten nitride is formed on the layer titanium nitride and a layer of tungsten is formed on the layer of tungsten nitride.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a method for manufacturing a semiconductor component having a tungsten-based contact metallization scheme that inhibits the formation of wormholes. In accordance with one aspect of the present invention a contact opening is formed that exposes either a semiconductor material or silicide. Then a sacrificial layer is formed in the contact opening. A reaction gas comprising, for example, tungsten hexafluoride is reacted with silane to form elemental tungsten and hydrofluoric acid. The hydrofluoric acid removes the sacrificial layer allowing tungsten to deposit on the semiconductor material or the silicide. The sacrificial layer prevents fluorine from forming pits in the semiconductor material, which subsequently become filled with tungsten to form wormholes.

In accordance with another aspect of the present invention a contact opening is formed that exposes either a semiconductor material or silicide. Then a sacrificial layer is formed in the contact opening. A reaction gas comprising, for example, tungsten hexafluoride is reacted with ammonia to form tungsten nitride and hydrofluoric acid. The hydrofluoric acid removes the sacrificial layer allowing tungsten nitride to deposit on the semiconductor material or the silicide. The sacrificial layer prevents fluorine from forming pits in the semiconductor material which may be filled with tungsten to form wormholes in the semiconductor material.

In accordance with another aspect of the present invention, a contact opening or hole is formed that exposes either a semiconductor material or a silicide. The exposed portions of the semiconductor material or the silicide are raised then tungsten is formed in the contact opening. For example, when the semiconductor substrate is silicon, additional silicon is formed on the exposed portions of the semiconductor substrate and on the sidewalls of the contact opening. The raised silicon prevents formation of wormholes in the silicon substrate by preventing halogens such as fluorine from attacking the silicon substrate. A tungsten containing layer is formed on the raised or additional silicon to form a tungsten silicon layer or a tungsten silicon nitride layer. Tungsten is then formed on the tungsten silicon layer or the tungsten silicon nitride layer.

In accordance with another aspect of the present invention, a contact opening is formed that exposes either a semiconductor material or a silicide layer. A layer of titanium nitride is formed in the contact hole using atomic layer deposition. An advantage of atomic layer deposition is that it is a low temperature process that provides a thin conformal layer of titanium nitride. The titanium nitride layer serves as both an adhesion layer and a protection layer. In particular, it prevents fluorine from attacking the semiconductor material or the silicide in the contact opening during formation of tungsten nitride or tungsten layers. Thus, it prevents wormhole formation.

Figure 1:
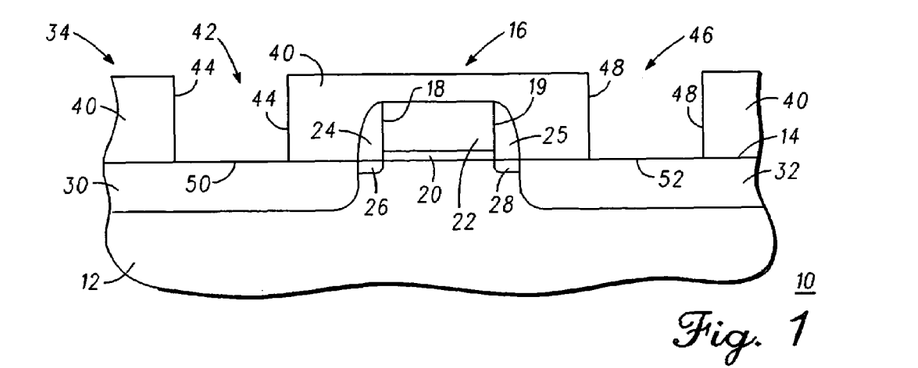
FIG. 1 is a cross-sectional side view of a semiconductor component during manufacture in accordance with an embodiment of the present invention.

FIG. 1 is an enlarged cross-sectional side view of a semiconductor component 10 during an intermediate stage of manufacture in accordance with an embodiment of the present invention. What is shown in FIG. 1 is a portion of a semiconductor substrate 12 having a major surface 14. It should be understood that the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 12 may be comprised of compound semiconductor materials such as gallium-arsenide, indium-phosphide, or the like. A gate structure 16 having sides 18 and 19 is disposed on a portion of major surface 14. Gate structure 16 comprises a gate dielectric material 20 having a gate conductor 22 disposed thereon. Source and drain extension regions 26 and 28, respectively, are aligned to sides 18 and 19 and extend into substrate 12. Spacers 24 and 25 are formed adjacent sides 18 and 19. Source and drain regions 30 and 32, respectively, are formed in the portions of substrate 12 adjacent spacers 24 and 25. Substrate 12, gate structure 16, spacers 24 and 25, source extension region 26, drain extension region 28, source region 30, and drain region 32 cooperate to form a semiconductor device 34. Although a field effect transistor is shown and described, it should be understood the type of semiconductor device is not a limitation of the present invention. Other suitable semiconductor devices include passive devices such as resistors, capacitors, and inductors, and active devices such as junction field effect transistors, bipolar junction transistors, or the like.

Still referring to FIG. 1, a layer of dielectric material 40 is formed on gate structure 16, spacers 24 and 25, and the exposed portions of semiconductor substrate 12. A layer of photoresist (not shown) is disposed on dielectric layer 40 and patterned to form openings that expose portions of dielectric layer 40. The exposed portions of dielectric layer 40 are anisotropically etched using, for example, a reactive ion etch, to form a contact opening or hole 42 having sidewalls 44 and a contact opening or hole 46 having sidewalls 48. Contact opening 42 exposes a portion 50 of semiconductor substrate 12 and contact opening 46 exposes a portion 52 of semiconductor substrate 12.

Figure 2:
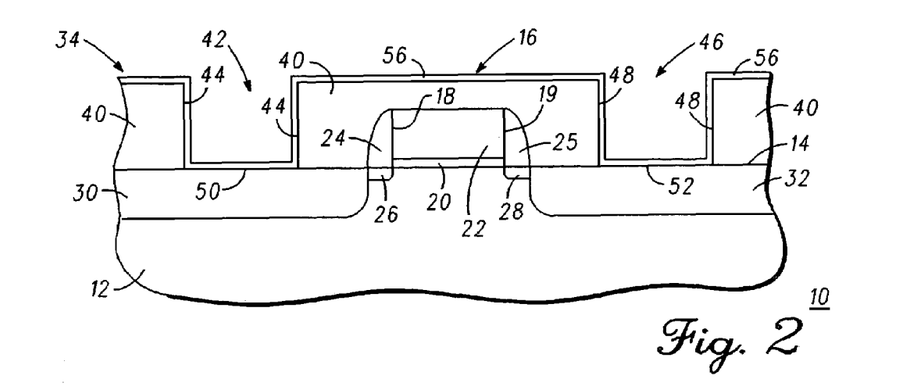
FIG. 2 is a cross-sectional side view of the semiconductor component of FIG. 1 further along in processing.

Referring now to FIG. 2, contact openings 42 and 46 are cleaned using either a wet clean such as, for example, by dipping semiconductor substrate 12 in dilute hydrofluoric acid or by using a plasma dry clean. The clean removes residual oxide or native oxide that may have formed in contact openings 42 and 46. This type of clean is often referred to as a pre-clean.

After the pre-clean, semiconductor substrate 12 is mounted to a wafer receptacle which is transferred to a reaction chamber of a metallization system. The reaction chamber is sealed under vacuum and the pressure in the reaction chamber is adjusted to range from about 100 milliTorr to about 1 Torr, i.e., about 13.32 Pascals to about 133.32 Pascals, respectively. The temperature within the reaction chamber is adjusted to be in a range from about 100 degrees Celsius (° C.) to about 800° C. If silicide layers such as nickel silicide (NiSi) are formed on semiconductor wafer 12, the temperature within the reaction chamber is preferably maintained at a level less than about 400° C.

A sacrificial layer of silicon dioxide 56 having a thickness ranging from about 1 Angstrom to about 5 Angstroms (Å) is conformally formed on dielectric material 40, sides 44 and 48, and portions 50 and 52 of substrate 12 using an atomic layer deposition process. Because the thicknesses of any residual oxide or any native oxide that may be formed are not uniform, they are removed using the pre-clean step. Silicon dioxide layer 56, on the other hand, has a well controlled thickness. Atomic layer deposition is capable of depositing silicon dioxide at deposition rates of less than about 1 Å per cycle, thus it allows formation of thin layers of silicon dioxide, e.g., silicon dioxide having a thickness of one to two layers. Alternatively, silicon dioxide layer 56 can be formed using a chemical vapor deposition (CVD) technique such as, for example, low pressure chemical vapor deposition (LPCVD).

After forming sacrificial silicon dioxide layer 56 and in accordance with one embodiment, a reaction gas comprising silane ($SiH_4$) and a reaction gas comprising tungsten hexafluoride ($WF_6$) are injected into the reaction chamber. Preferably, the reaction chamber is maintained at a temperature ranging from about 250° C. to about 500° C., the silane ($SiH_4$) is injected into the reaction chamber at a flow rate ranging from about 10 standard cubic centimeters per minute (sccm) to about 200 sccm, and the tungsten hexafluoride is injected at a rate ranging from about 20 sccm to about 250 sccm.

Figure 3:
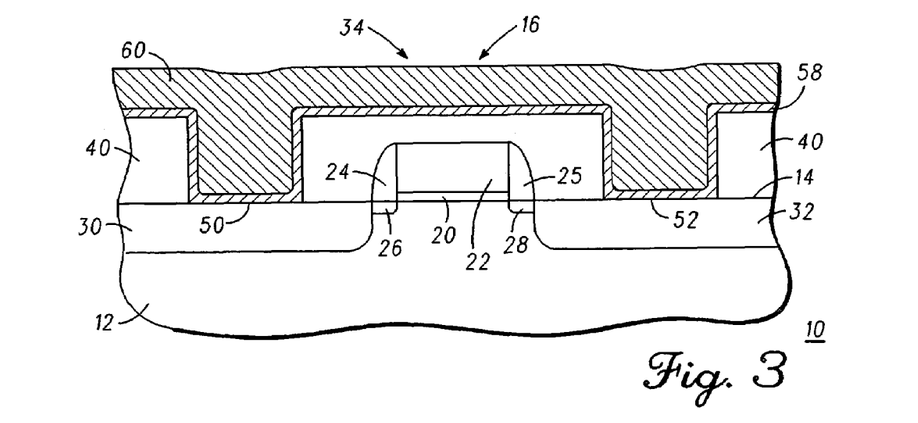
FIG. 3 is a cross-sectional side view of the semiconductor component of FIG. 2 further along in processing.

Referring now to FIG. 3, the silane reacts with the tungsten hexafluoride to form elemental tungsten, silicon tetrafluoride vapor, hydrofluoric acid vapor and hydrogen. The silicon tetrafluoride and hydrogen vapors do not react with semiconductor substrate 12. However, the hydrofluoric acid vapor etches away sacrificial silicon dioxide layer 56. The elemental tungsten replaces the silicon dioxide thereby forming a tungsten layer 58. In other words, the elemental tungsten deposits on portions 50 and 52 of semiconductor substrate 12, sidewalls 44 and 48, and dielectric layer 40. Preferably, the elemental tungsten is formed on semiconductor substrate 12 contemporaneously with the removal of sacrificial silicon dioxide layer 56.

In accordance with another embodiment, a reaction gas comprising ammonia ($NH_3$) and a reaction gas comprising tungsten hexafluoride ($WF_6$) are injected into the reaction chamber. Preferably, the reaction chamber is maintained at a temperature ranging from about 300° C. to about 450° C., the ammonia is injected into the reaction chamber at a flow rate ranging from about 10 sccm to about 100 sccm, and the tungsten hexafluoride is injected at a rate ranging from about 20 sccm to about 250 sccm. In this embodiment, the ammonia reacts with the tungsten hexafluoride to form tungsten nitride and hydrofluoric acid vapor. The hydrofluoric acid vapor etches away sacrificial silicon dioxide layer 56. The tungsten nitride layer replaces the silicon dioxide, thereby forming a tungsten nitride layer. Thus, tungsten nitride deposits on portions 50 and 52 of semiconductor substrate 12, sidewalls 44 and 48, and dielectric layer 40. It should be noted that in this embodiment layer 58 is tungsten nitride rather than tungsten.

Still referring to FIG. 3, a layer of tungsten 60 having a thickness ranging from about 500 Å to about 5,000 Å is conformally formed on tungsten or tungsten nitride layer 58 using, for example, chemical vapor deposition. Preferably, layer of tungsten 60 completely fills openings 42 and 46.

Figure 4:
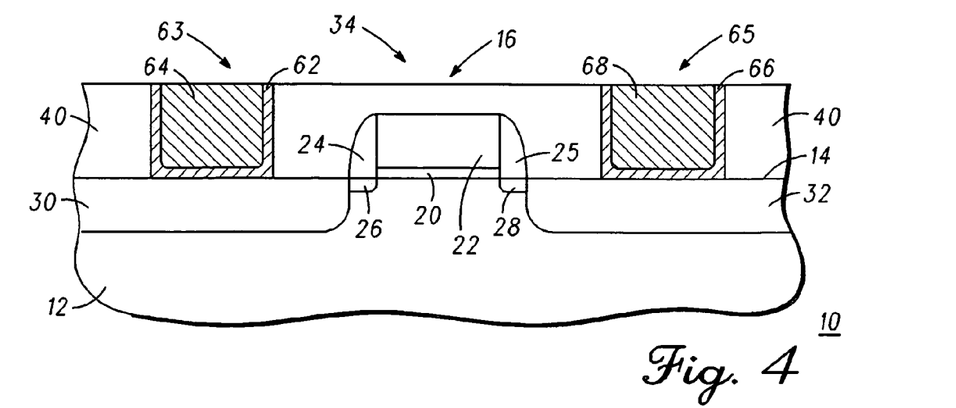
FIG. 4 is a cross-sectional side view of the semiconductor component of FIG. 3 further along in processing.

Referring now to FIG. 4, tungsten layers 60 and 58 are planarized using, for example, a Chemical Mechanical Polishing (CMP) technique having a high selectivity to oxide layer 40. Therefore, the planarization process stops on oxide layer 40. After planarization, portion 62 of tungsten layer 58 and portion 64 of tungsten layer 60 remain in opening 42, and portion 66 of tungsten layer 58 and portion 68 of tungsten layer 60 remain in opening 46. The method for planarizing tungsten layers 60 and 58 is not a limitation of the present invention. Other suitable planarization techniques include electropolishing, electrochemical polishing, chemical polishing, and chemically enhanced planarization.

In accordance with this embodiment, a sacrificial layer 56 is formed in the contact opening and protects the tungsten from forming wormholes in the semiconductor substrate 12. Reactants are selected such that hydrofluoric acid vapor is generated and removes the sacrificial layer. The combination of the sacrificial layer and the reaction byproducts block fluorine from attacking semiconductor substrate 12. As the sacrificial layer is consumed, it is replaced by tungsten, thereby forming a tungsten nucleation layer on which additional tungsten may be deposited to form tungsten contacts (63, 65).

Figure 5:
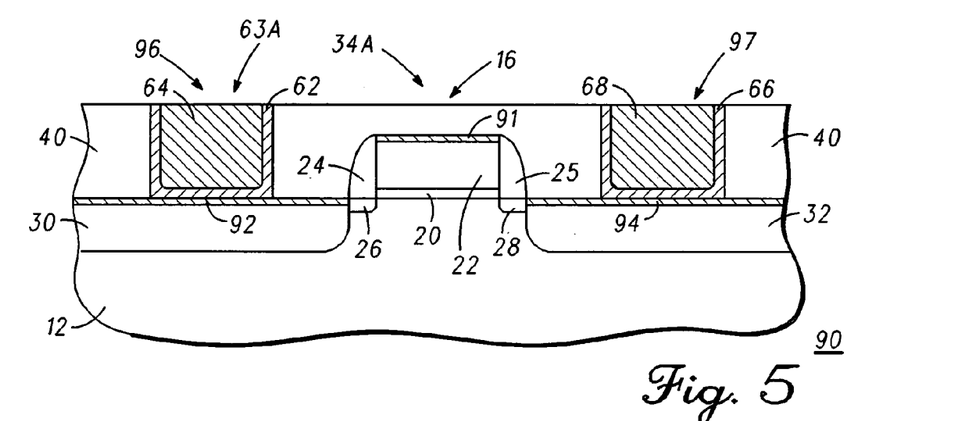
FIG. 5 is a cross-sectional side view of a semiconductor component in accordance with another embodiment of the present invention.

FIG. 5 illustrates cross-sectional side view of a semiconductor component 90 in accordance with another embodiment of the present invention. Semiconductor component 90 includes substrate 12, gate structure 16, spacers 24 and 25, source extension region 26, source region 28, drain extension region 30, drain region 32, dielectric layer 40, portions 62 and 64 of layers 58 and 60, respectively, and portions 66 and 68 of layers 58 and 60, respectively. Unlike semiconductor component 10, a silicide layer 91 is formed from gate conductor 22, a silicide layer 92 is formed from source region 30, and a silicide layer 94 is formed from drain region 32. Portions 62, 64, and 92 cooperate to form a contact 63A and portions 66, 68, and 94 cooperate to form a contact 63B. Because semiconductor component 90 includes silicide regions 91, 92, and 94, the transistor is identified by reference number 34A rather than reference number 34 as described with reference to semiconductor component 10.

In accordance with this embodiment, sacrificial layer 56 is formed in the contact opening that protects the tungsten from forming wormholes in silicon. Reactants are selected such that hydrofluoric acid vapor is generated that removes the sacrificial layer. The combination of the sacrificial layer and the reaction byproducts block fluorine from attacking semiconductor substrate 12. As the sacrificial layer is consumed, it is replaced by tungsten nitride, thereby forming a tungsten barrier layer suitable for deposition of additional tungsten to form a tungsten contact.

Figure 6:
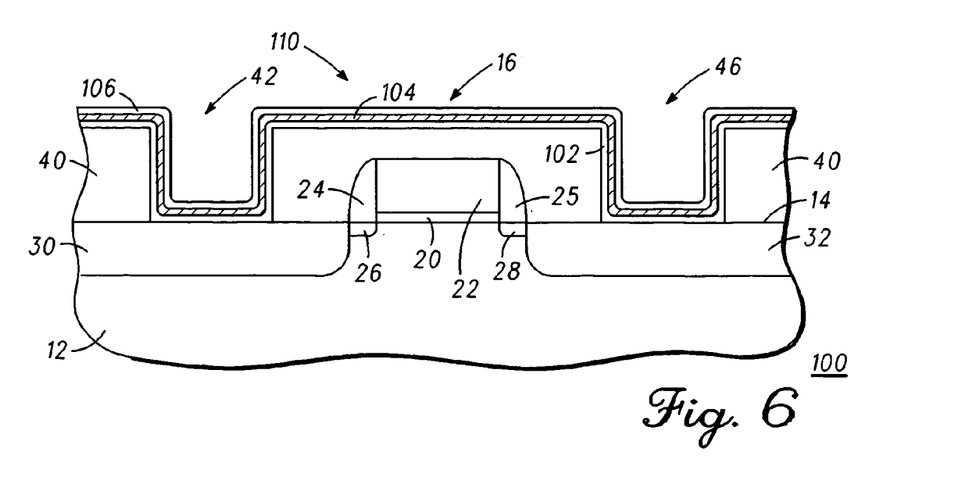
FIG. 6 is a cross-sectional side view of a semiconductor component during manufacture in accordance with yet another embodiment of the present invention.

FIG. 6 is a cross-sectional side view of a semiconductor component 100 at an intermediate stage of manufacture in accordance with another embodiment of the present invention. It should be noted that the beginning processing steps for forming semiconductor components 10 and 100 as described and shown with reference to FIG. 1 may be the same. Accordingly, FIG. 6 continues from FIG. 1 but with reference number 10 shown in FIG. 1 replaced by reference number 100 and the transistor identified by reference number 110, rather than reference numbers 34. Semiconductor substrate 12 is placed in a multi-chamber metallization system (not shown) for formation of a silicon layer 102, a tungsten layer 104, and a nitride layer 106. More particularly, semiconductor substrate 12 is mounted to a wafer receptacle which is transferred to a first chamber of a multi-chamber metallization system. In the first chamber, the residual oxide or the native oxide that may have formed in contact openings 42 and 46 is removed. The first chamber is sealed under vacuum, the pressure in the first chamber is adjusted to range from about 100 milliTorr to about 1 Torr, i.e., about 13.32 Pascals to about 133.32 Pascals, respectively, and the temperature is adjusted to a range from about 100° C. to about 500° C. The residual oxide or the native oxide may be removed using a hydrofluoric acid (HF) vapor, an ammonia ($NH_3$) plasma, a remote plasma nitrogen trifluoride ($NF_3$) plasma, or the like.

After removing the residual oxide or the native oxide, the wafer receptacle carrying semiconductor substrate 12 is transferred to a second process chamber of the multi-chamber metallization system. This transfer occurs without breaking the vacuum seal. The pressure in the second chamber is set to be substantially the same as the pressure in the first chamber and a bias power ranging from about 75 Watts to about 500 Watts is applied to the wafer receptacle. The second chamber is maintained at a temperature ranging from about 100° C. to about 500° C.

A reaction gas is injected into the second chamber and a plasma is ignited to promote deposition of conformal layer of semiconductor material 102 on dielectric material 40, sides 44 and 48, and portions 50 and 52 of substrate 12 using an atomic layer deposition process. Preferably, the reaction gas is silane ($SiH_4$) and is injected into the second chamber at a flow rate ranging from about 15 sccm to about 50 sccm and the plasma ignition power level is set to a value ranging from about 200 Watts to about 800 Watts. In accordance with one embodiment, semiconductor material 102 is silicon having a thickness ranging from about a monolayer to about 75 Å. Alternatively, silicon layer 102 may have a thickness ranging from about 5 Å to about 50 Å. After forming silicon layer 102 of the desired thickness, the unreacted silane is purged from the second chamber using an inert gas such as, for example, argon (Ar) as the purging gas. The purging gas is not limited to argon, but may be any suitable inert gas.

After purging the silane reaction gas, a monoatomic tungsten layer 104 is formed on silicon layer 102 using for example atomic layer deposition. Tungsten layer 104 may be formed by injecting a reaction gas comprising tungsten into the second chamber to form a monoatomic layer of tungsten. By way of example, the reaction gas is tungsten hexafluoride ($WF_6$) which is injected at a flow rate ranging from about 5 sccm to about 75 sccm. During the formation of tungsten layer 104, the bias power is preferably maintained at a value ranging from about 75 Watts to about 500 Watts and the plasma ignition power is maintained at a power ranging from about 200 Watts to about 800 Watts. After forming the tungsten layer of the desired thickness, the unreacted tungsten hexafluoride is purged from the second chamber using an inert gas as the purging gas. Suitable inert gases include argon (Ar), nitrogen ($N_2$), or the like.

After purging the tungsten hexafluoride reaction gas from the second reaction chamber, monoatomic nitride layer 106 is formed on monoatomic tungsten layer 104 using atomic layer deposition. Monoatomic nitride layer 106 may be formed by injecting a reaction gas comprising nitrogen into the second chamber. By way of example, the reaction gas is ammonia ($NH_3$) and is injected at a flow rate ranging from about 2 sccm to about 20 sccm. After forming nitride layer 106, the unreacted ammonia is purged from the second chamber using an inert gas as the purging gas.

Figure 7:
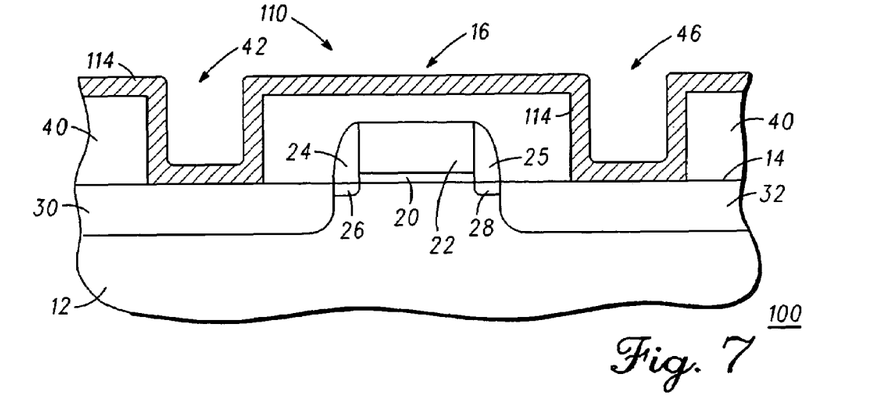
FIG. 7 is a cross-sectional side view of the semiconductor component of FIG. 6 further along in processing.

Referring now to FIG. 7, because the temperature is maintained in a range from about 100° C. to about 500° C., the vacuum seal is kept intact, and the pressure within the second chamber is maintained at a value ranging from about 100 milliTorr to about 1 Torr, i.e., about 13.32 Pascals to about 133.32 Pascals, respectively, layers 106, 108, and 110 react to form a single layer 114 of tungsten silicon nitride ($WSiN_x$) having a thickness ranging from about 5 Å to about 50 Å. The thickness of the of tungsten silicon nitride layer 114 can be increased by sequentially and repetitively forming silicon, tungsten, and nitride layers such as layers 106, 108, and 110, respectively, using atomic layer deposition.

Figure 8:
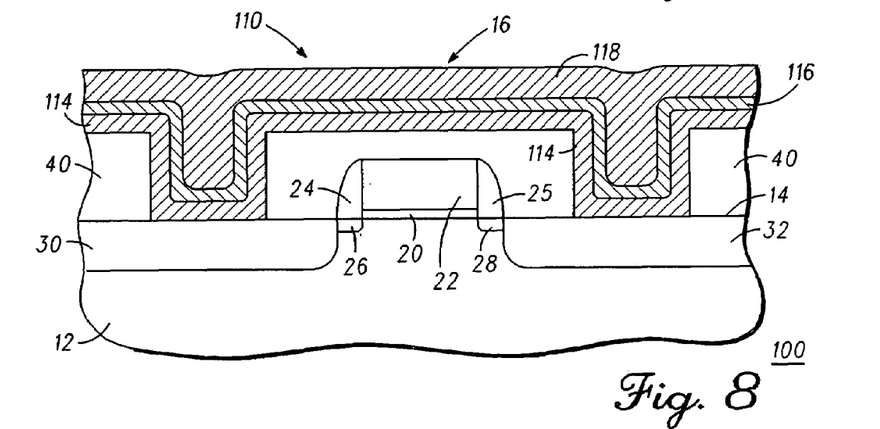
FIG. 8 is a cross-sectional side view of the semiconductor component of FIG. 7 further along in processing.

Referring now to FIG. 8, a layer of tungsten 116 having a thickness ranging from about 10 Å to about 150 Å is conformally formed on tungsten silicon nitride layer 114 using atomic layer deposition. A layer of tungsten 118 is formed on tungsten layer 116 such that it completely fills openings 42 and 46. Tungsten layer 116 serves as a nucleation layer for tungsten layer 118.

Figure 9:
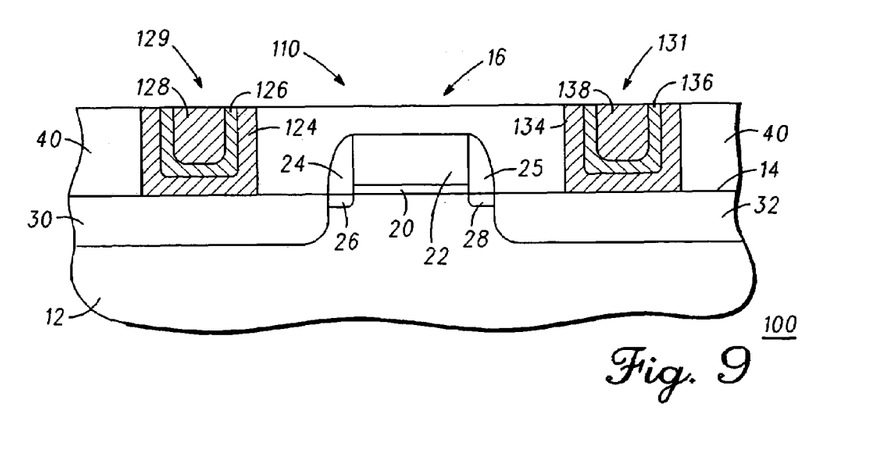
FIG. 9 is a cross-sectional side view of the semiconductor component of FIG. 8 further along in processing.

Referring now to FIG. 9, tungsten layers 118 and 116 and tungsten silicon nitride layer 114 are planarized using, for example, a Chemical Mechanical Polishing (CMP) technique having a high selectivity to oxide layer 40. Thus, the planarization stops on oxide layer 40. After planarization, portions 124 and 134 of tungsten silicon nitride layer 114, portions 126 and 136 of tungsten layer 116, and portions 128 and 138 of tungsten layer 118 remain in openings 42 and 46, respectively. Portions 124, 126, and 128 cooperate to form a contact 129 and portions 134, 136, and 138 cooperate to form a contact 131. The method for planarizing tungsten layers 118 and 116 and tungsten silicon nitride layer 114 is not a limitation of the present invention. Other suitable planarization techniques include electropolishing, electrochemical polishing, chemical polishing, and chemically enhanced planarization.

In accordance with this embodiment, additional semiconductor material is grown on the exposed portions of the semiconductor substrate and the dielectric material to form a raised substrate. Any fluorine that may attack the semiconductor material, attacks the silicon of the raised substrate rather than that of the semiconductor substrate. It has been discovered that attacking the raised silicon does not degrade the performance of the semiconductor component like attacking the semiconductor substrate. The semiconductor material formed in the contact opening protects the semiconductor substrate from having wormholes formed therein.

Figure 10:
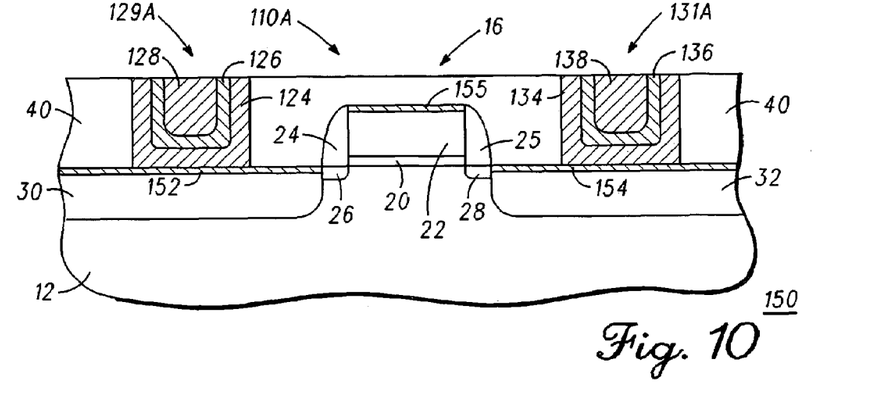
FIG. 10 is a cross-sectional side view of a semiconductor component in accordance with yet another embodiment of the present invention.

FIG. 10 illustrates a cross-sectional side view of a semiconductor component 150 in accordance with another embodiment of the present invention. Semiconductor component 150 includes substrate 12, gate structure 16, spacers 24 and 25, source extension region 26, source region 28, drain extension region 30, drain region 32, dielectric layer 40, and portions 124 and 134, portions 126 and 136, and portions 128 and 138 of layers 114, 116, and 118, respectively. Unlike semiconductor component 100, a silicide layer 152 is formed from source region 28, a silicide layer 154 is formed from drain region 32, and a silicide layer 155 is formed from gate conductor 22. Portions 124, 126, and 128, and silicide layer 152 cooperate to form a contact 129A and portions 134, 136, and 138, and silicide layer 154 cooperate to form a contact 131A. Because semiconductor component 150 includes silicide layers 152, 154, and 155, the transistor is identified by reference number 110A rather than reference number 110 as described with reference to semiconductor component 100.

Figure 11:
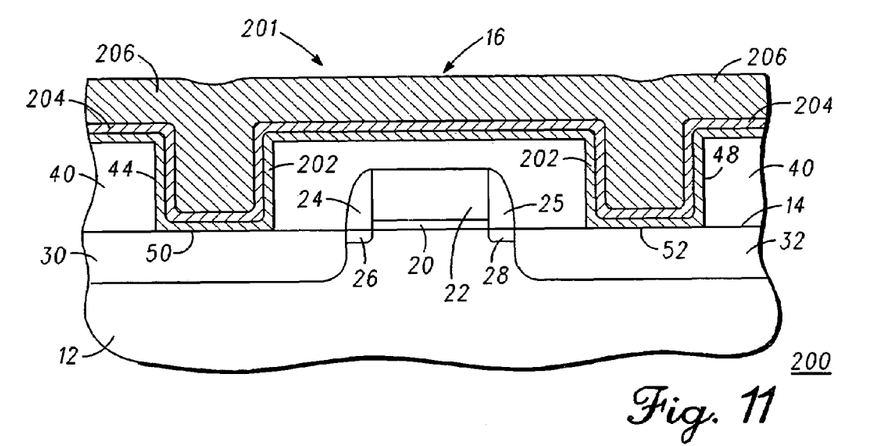
FIG. 11 is a cross-sectional side view of a semiconductor component during manufacture in accordance with yet another embodiment of the present invention.

FIG. 11 is a cross-sectional side view of a semiconductor component 200 at an intermediate stage of manufacture in accordance with another embodiment of the present invention. It should be noted that the beginning processing steps for forming semiconductor components 10 and 200 as described and shown with reference to FIG. 1 may be the same. Accordingly, FIG. 11 continues from FIG. 1 but with reference number 10 shown in FIG. 1 replaced by reference number 200 and reference number 34 replaced by reference number 201. Semiconductor substrate 12 is placed in a multi-chamber metallization system (not shown) for formation of a titanium nitride layer 202, a tungsten nitride layer 204, and a tungsten layer 206. More particularly, semiconductor substrate 12 is mounted to a wafer receptacle which is transferred to a first chamber of the multi-chamber metallization system. In the first chamber, any residual oxide or any native oxide that may have formed in contact openings 42 and 46 is removed. The first chamber is sealed under vacuum, the pressure in the first chamber is adjusted to range from about 100 milliTorr to about 1 Torr, i.e., about 13.3.2 Pascals to about 133.32 Pascals, respectively, and the temperature is adjusted to a value in a range from about 100° C. to about 500° C. The residual oxide or the native oxide may be removed using a hydrofluoric acid (HF) vapor, an ammonia ($NH_3$) plasma, a remote plasma nitrogen trifluoride ($NF_3$) plasma, or the like.

After removing the residual oxide or the native oxide, the wafer receptacle carrying semiconductor substrate 12 is transferred to a second process chamber of the multi-chamber metallization system. This transfer occurs without breaking the vacuum seal. The pressure in the second chamber is set to be substantially the same as the pressure in the first chamber and a bias power ranging from about 75 Watts to about 500 Watts is applied to the wafer receptacle. The second chamber is maintained at a temperature ranging from about 100° C. to about 500° C.

Still referring to FIG. 11, a reaction precursor vapor is carried by helium into the second chamber at a flow rate ranging from about 100 sccm to about 500 sccm and thermally decomposed using atomic layer deposition to form a conformal layer of titanium nitride 202 on dielectric material 40, sides 44 and 48, and portions 50 and 52 of substrate 12. Suitable reaction precursors include tetra-kis (di-methyl amino) titanium (TDMAT), tetra-kis(di-ethyl amino) titanium (TDEAT), $Ti[N(C_8H_{(2n+1)})_2]_4$ (n=3, 4), or the like. Preferably, titanium nitride layer 202 has a thickness ranging from about a monolayer to about 10 Å. After the forming titanium nitride of the desired thickness, the unreacted reaction precursor is purged from the second chamber using an inert gas such as, for example, Helium (He) or argon (Ar) as the purging gas. The purging gas is not limited to argon, but may be any suitable inert gas.

After purging the reaction precursor, a tungsten nitride ($WN_x$) layer 204 having a thickness ranging from about 10 Å to about 100 Å is formed on titanium nitride layer 202 using atomic layer deposition. Tungsten nitride layer 204 may be formed by injecting ammonia ($NH_3$) and tungsten hexafluoride ($WF_6$) into the second reaction chamber. Preferably, the second reaction chamber is maintained at a temperature ranging from about 300° C. to about 450° C. After tungsten nitride of the desired thickness has been formed, the unreacted ammonia tungsten hexafluoride is purged from the second reaction chamber using an inert gas as the purging gas. Suitable inert gases include argon (Ar), nitrogen, ($N_2$), or the like.

A layer of tungsten 206 is formed on tungsten nitride layer 204 such that it completely fills openings 42 and 46.

Figure 12:
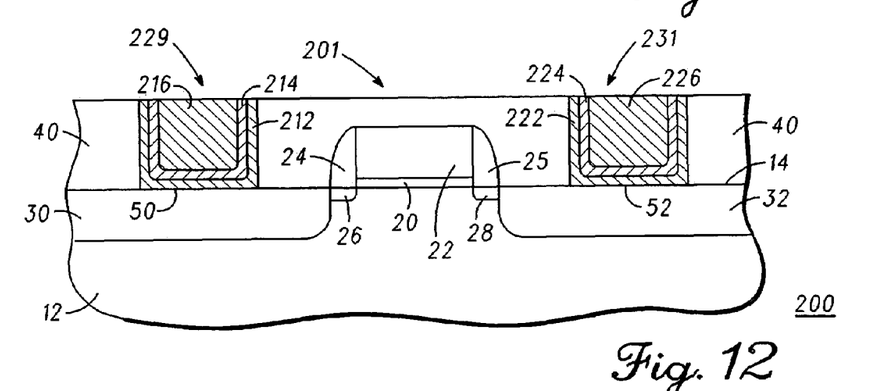
FIG. 12 is a cross-sectional side view of the semiconductor component of FIG. 11 further along in processing.

Referring now to FIG. 12, tungsten layer 206, tungsten nitride layer 204, and titanium nitride layer 202 are planarized using, for example, a Chemical Mechanical Planarization (CMP) technique having a high selectivity to oxide layer 40. Thus, the planarization stops on oxide layer 40. After planarization, portions 216 and 226 of tungsten layer 206, portions 214 and 224 of tungsten nitride layer 204, and portions 212 and 222 of titanium nitride layer 202 remain in openings 42 and 46, respectively. Portions 212, 214, and 216 cooperate to form a contact 229 and portions 222, 224, and 226 cooperate to form a contact 231. The method for planarizing tungsten layer 206, tungsten nitride layer 204, and titanium nitride layer 202 is not a limitation of the present invention. Other suitable planarization techniques include electropolishing, electrochemical polishing, chemical polishing, and chemically enhanced planarization.

Figure 13:
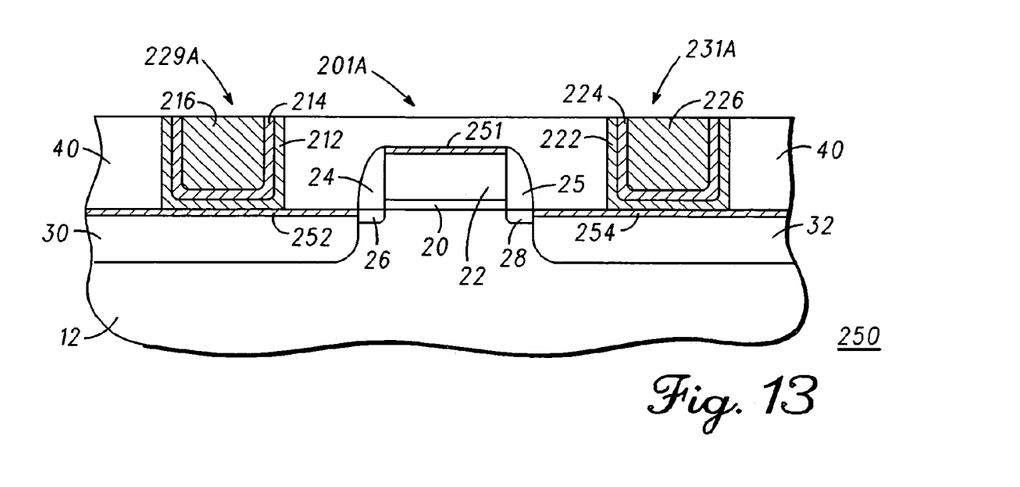
FIG. 13 is a cross-sectional side view of a semiconductor component in accordance with yet another embodiment of the present invention.

FIG. 13 illustrates a cross-sectional side view of a semiconductor component 250 in accordance with another embodiment of the present invention. Semiconductor component 250 includes substrate 12, gate structure 16, spacers 24 and 25, source extension region 26, source region 28, drain extension region 30, drain region 32, dielectric layer 40, and portions 216 and 226, 214 and 224, and 212 and 222 of layers 206, 204, and 202, respectively. Unlike semiconductor component 200, a silicide layer 251 is formed from gate conductor 22, a silicide layer 252 is formed from source region 28, and a silicide layer 254 is formed from drain region 32. Portions 212, 214, and 216 and silicide layer 252 cooperate to form a contact 229A and portions 222, 224, and 226 and silicide layer 254 cooperate to form a contact 231A. Because semiconductor component 250 includes silicide regions 251, 252, and 254, the transistor is identified by reference number 201A rather than reference number 34 as described with reference to semiconductor component 10.

By now it should be appreciated that a method for manufacturing a semiconductor component having a contact metallization system comprising tungsten has been provided. In accordance with the present invention, semiconductor materials or silicide materials are protected from attack by halogens such as fluorine during the deposition of the tungsten. Thus, wormholes are not formed in the semiconductor material or the silicide thereby lowering the contact resistance and improving reliability of the semiconductor component. Because the tungsten is deposited using an atomic layer deposition technique, the layers of tungsten can be formed having uniform thicknesses. In addition, the throughput is increased and the cost of manufacturing the semiconductor components is decreased. Another advantage is that the present invention improves the adhesion of tungsten to the semiconductor substrate.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:

providing a semiconductor substrate;

forming a layer of dielectric material over the semiconductor substrate;

forming a contact opening in the layer of dielectric material, the contact opening having a floor and sidewalls, wherein a portion of the semiconductor substrate serves as the floor of the contact opening;

forming a layer of silicon dioxide on the floor and the sidewalls using atomic layer deposition;

removing the layer of silicon dioxide with a hydrofluoric acid vapor to expose the floor of the contact opening, and depositing one of elemental tungsten or tungsten nitride on the floor of the contact opening.

2. The method of claim 1, further comprising reacting a first reaction gas with a second reaction gas to form a first product capable of etching the layer of silicon dioxide and a second product capable of forming the elemental tungsten or tungsten nitride.

3. The method of claim 2, wherein the first reaction gas comprises silane and the second reaction gas comprises tungsten hexafluoride.

4. The method of claim 2, wherein the first reaction gas comprises ammonia and the second reaction gas comprises tungsten hexafluoride.

* * * * *